(12) United States Patent
Ruhm

(10) Patent No.: US 7,843,195 B2
(45) Date of Patent: Nov. 30, 2010

(54) METHOD FOR DETERMINING THE SPATIAL DISTRIBUTION OF MAGNETIC RESONANCE SIGNALS WITH USE OF LOCAL SPATIALLY ENCODING MAGNETIC FIELDS

(75) Inventor: Wolfgang Ruhm, Ettlingen (DE)

(73) Assignee: Bruker Biospin MRI GmbH, Ettlingen (DE)

( * ) Notice: Subject to any disclaimer, the term of this patent is extended or adjusted under 35 U.S.C. 154(b) by 78 days.

(21) Appl. No.: 12/453,025

(22) Filed: Apr. 28, 2009

(65) Prior Publication Data

US 2009/0273345 A1 Nov. 5, 2009

(30) Foreign Application Priority Data

Apr. 30, 2008 (DE) .................. 10 2008 021 736

(51) Int. Cl.
*G01V 3/00* (2006.01)
(52) U.S. Cl. ...................... 324/309; 324/307
(58) Field of Classification Search ......... 324/300–322; 600/407–445
See application file for complete search history.

(56) References Cited

U.S. PATENT DOCUMENTS

| | | | |
|---|---|---|---|
| 5,270,653 A | 12/1993 | Pauly | |
| 5,530,354 A | 6/1996 | Herlihy | |
| 5,903,149 A | 5/1999 | Gonen | |
| 6,005,391 A | 12/1999 | Bornert | |
| 6,255,821 B1 | 7/2001 | Oppelt | |
| 7,106,060 B2 * | 9/2006 | Hennig | 324/309 |
| 7,411,397 B2 * | 8/2008 | Shankaranarayanan et al. | 324/309 |
| 7,719,269 B2 * | 5/2010 | Petersson et al. | 324/307 |
| 7,772,844 B2 * | 8/2010 | Hurd | 324/309 |
| 2004/0140802 A1 | 7/2004 | Zhang | |

(Continued)

FOREIGN PATENT DOCUMENTS

EP 2 060 927 5/2009

(Continued)

OTHER PUBLICATIONS

Hennig, J. et al. "PatLoc: Imaging in Non-Bijective, Curvilinear Magnetic Field Gradients". In: Proc. Ann. Meeting ISMRM, Berlin, p. 453(2007).

(Continued)

*Primary Examiner*—Brij B Shrivastav
(74) *Attorney, Agent, or Firm*—Paul Vincent

(57) ABSTRACT

A method for determining the spatial distribution of magnetic resonance (MR) signals from an imaging region has a preparatory step in which an encoding scheme with I phase encoding steps is defined, for each phase encoding step according to the phase encoding scheme, an excitation pattern of the transverse magnetization is defined and RF pulses to be irradiated to implement this pattern are calculated, wherein the same phase is defined at all spatial locations of the imaging region within an MSEM region and, in the execution step, according to the spatial encoding scheme each encoding step is performed I times according to the phase encoding scheme, wherein selection of the imaging region, amplitude modulation, and phase encoding are performed with the calculated RF pulses during excitation of the nuclear spin. This results in unique determination of the spatial distribution of the magnetic resonance signals with a simple RF receiver configuration using local gradient systems.

28 Claims, 7 Drawing Sheets

U.S. PATENT DOCUMENTS

| | | | |
|---|---|---|---|
| 2007/0007959 A1 | 1/2007 | Szyperski | |
| 2007/0090838 A1* | 4/2007 | Hennig | 324/307 |
| 2009/0072827 A1 | 3/2009 | Hargreaves | |
| 2009/0128148 A1* | 5/2009 | Hennig et al. | 324/309 |
| 2010/0156417 A1* | 6/2010 | Petersson et al. | 324/309 |

FOREIGN PATENT DOCUMENTS

| | | |
|---|---|---|
| WO | WO 01/22879 | 4/2001 |
| WO | WO 2009/036936 | 3/2009 |

OTHER PUBLICATIONS

Welz, A. M. et al. "Initial Realization of a Multichannel, Non-Linear PatLoc Gradient Coil". In: Proc. Ann. Meeting ISMRM, Toronto, p. 1163(2008).

Schultz, G., Hennig, J. und Zaitsev, M. "Image Reconstruction from Ambiguous PatLoc-Encoded MR Data". In: Proc. Ann. Meeting ISMRM, Toronto, p. 786(2008).

Saekho, S.; Yip, C.-Y.; Noll, D. C.; Boada, F. E.; Stenger, V. A. "Fast-$k_z$ three-dimensional tailored radiofrequency pulse for reduced B1 inhomogeneity". In: Magnetic Resonance in Medicine 55 (2006), pp. 719-724.

Ruhm, W. und Ulmann, P. "Multidimensional Spatial Encoding by Parallel Excitation". In: Proc. Ann. Meeting ISMRM, Toronto, p. 1318(2008).

Pauly, J.; Nishimura, D.; Macovski A. "A k-space analysis of small-tip-angle excitation". In: Journal of Magnetic Resonance B1 (1989), pp. 43-56

Katscher U.; Boernert, P.; Leussler, C.; Van Den Brink, J. S "Transmit Sense". In: Magnetic Resonance in Medicine 49 (2003), p. 144-150.

King, S.B. et al. "Phase Encoding Without Gradients Using TRASW-FSE MRI". In: Proc. Ann. Meeting ISMRM, Berlin, p. 680(2007).

Yip, C.-Y.; Fessler, J. A.; Noll, D. C. "Iterative RF pulse design for multidimensional, small-tip-angle selective excitation". In: Magnetic Resonance in Medicine 54 (2005), p. 908-917.

Grissom, W.; Yip, C.-Y.; Zhang, Z.; Stenger, V. A.; Fessler, J. A.; Noll, D. C. "Spatial domain method for the design of RF pulses in multicoil parallel excitation". In: Magnetic Resonance in Medicine 56 (2006), p. 620-629.

Fernández-Seara, M.A.; Wehrli, S.L.; Wehrli, F.W.. "Multipoint mapping for imaging of semi-solid materials". In: Journal of Magnetic Resonance 160 (2003) 144-150.

Yip, C.-Y.; Fessler, J.A.; Noll, D. "Advanced Three-Dimensional Tailored RF Pulse for Signal Recovery in $T_2$-Weighted Functional Magnetic Resonance Imaging". Mangnetic Resonance in Medicine 56:(2006) 1050-1059.

Metzger, G. J. et al. "Local $B_1^+$ Shimming for Prostate Imaging with Transceiver Arrays at 7T Based on Subject-Dependent Transmit Phase Measurements". Magnetic Resonance in Medicine 59 (2008);:p. 396-409.

Katscher, U. et al. "B1-Gradient Based MRI Using a Multi-Element Transmit System". In: Proc. Ann. Meeting ISMRM, Berlin, p. 679(2007).

* cited by examiner

METHOD FOR DETERMINING THE SPATIAL DISTRIBUTION OF MAGNETIC RESONANCE SIGNALS WITH USE OF LOCAL SPATIALLY ENCODING MAGNETIC FIELDS

BACKGROUND OF THE INVENTION

The invention relates to a method for determining the spatial distribution of magnetic resonance signals from a predetermined imaging region that is completely covered by N MSEM regions (MSEM=monotonic spatially encoding magnetic field) within a volume under examination of a magnetic resonance apparatus, with $N \geq 1$, wherein, in a preparatory step, a spatial encoding scheme P with M encoding steps, $M \geq 1$, for spatial encoding in L spatial dimensions within the imaging region is defined; wherein, in an execution step, for each encoding step of the spatial encoding scheme P, nuclear spins are excited in the volume under examination by at least one RF pulse by means of RF transmitter antenna equipment having at least one transmitter element; after this RF excitation, spatial encoding is performed according to the spatial encoding scheme P by means of additional magnetic fields, variable over time and space, of a global and/or local gradient system, wherein the spatial encoding is performed in at least one spatial dimension by means of the local gradient system and is unique within each of the N MSEM regions, which are non-overlapping, but is not unique for multiple MSEM regions and not in the entire volume under examination, and wherein the spatial encoding performed by the global gradient system is unique in the entire volume under examination with respect to each of the dimensions to be mapped, and magnetic resonance signals generated by the excited nuclear spins are acquired by means of RF receiver antenna equipment with at least one receiver element; wherein, in a reconstruction step, one or more spatial distributions of the magnetic resonance signals or quantities derived from them are calculated from the magnetic resonance signals acquired in all encoding steps according to the spatial encoding scheme P; and wherein, in a visualization step, the results of the reconstruction and/or one or more quantities derived from them are stored and/or visualized.

Such methods are known from [1], [2], and [3]. In these methods known from prior art, the unique determination of the spatial distribution of the magnetic resonance signals is performed for the entire imaging region in all dimensions to be mapped by means of RF receiver equipment with at least N elements, where N is the number of regions with locally uniquely spatially encoding additional magnetic fields and each receiver element exhibits different sensitivities for magnetic resonance signals from different regions. According to [1] and [2], one RF receiver element is deployed for each of these regions, whose receiver sensitivity spatially focuses on this region.

Magnetic resonance imaging (MRI), also termed magnetic resonance tomography (MRT), and spatially resolved magnetic resonance spectroscopy (MRS), also termed spectroscopic imaging (SI), chemical shift imaging (CSI) or multi-voxel localization MRS, are widespread techniques for non-destructive acquisition of images of the interior of an object under examination and are based on the spatially resolved measurement of magnetic resonance signals from the object under examination. By subjecting the object under examination to an essentially static and homogenous magnetic basic field inside a basic field magnet, nuclear spins contained in it are oriented in the direction of the basic field, usually selected as the z-direction of a magnet-bound coordinate system. During an MR examination, irradiation with electromagnetic radio-frequency (RF) pulses by means of one or more RF transmission antennas excites the such oriented nuclear spins of the object under examination to precession movements whose frequencies are proportional to the local magnetic field strengths. In the case of the MRI and SI methods generally used today, spatial encoding is imposed on the precession movements of the nuclear spins by superpositions varying over time of additional magnetic fields varying over space, for all spatially resolving spatial directions. These fields are usually produced in three variants as magnetic fields increasing linearly over space in three orthogonal spatial directions by means of a gradient system and termed gradient (fields) $G_x$, $G_y$, and $G_z$. The spatial encoding is usually described by a scheme in so-called k-space, which is related to geometric or physical space via a Fourier transformation. The transverse component of the magnetization associated with the processing nuclear spins induces electrical voltage signals in one or more RF receiver antennas, which usually surround the object under examination. By means of pulse sequences that contain specially selected trains of RF pulses and gradient pulses, magnetic resonance signals that are variable over time are generated in such a way that they can be converted to corresponding spatial images. This is performed according to one of many well-known reconstruction techniques, after the RF signals have been acquired, amplified, and digitized using an electronic receiver system, and processed and stored in two- or multidimensional datasets using a computer system. The pulse sequence used typically contains a succession of measurement procedures, also termed spatial encoding steps, in which the gradient pulses vary according to the selected localization method in accordance with the encoding scheme used. A single spatial encoding step comprises the excitation of nuclear spins, spatial encoding, and the acquisition of MR signals.

One essential requirement for accurate spatial mapping of the magnetic resonance signals of the object under examination is that the technical imperfections of the MR measurement system are negligible or the deviations from the ideal behavior are known and can be corrected accordingly.

In magnetic resonance imaging and spatially resolved magnetic resonance spectroscopy, spatial localization is usually achieved by performing either Fourier encoding or spatially selective excitation [7, 8].

In Fourier encoding, the nuclear spins to be examined are excited simultaneously in the entire volume under examination and their spatial localization is implemented by superposing a spatially dependent phase and/or frequency encoding on their precession movements. This superposition of the spatial encoding is performed using gradient pulses, that is, variations over time of the magnetic field strength of one or more variants of the additional magnetic fields produced by the gradient system. In classic MR imaging, this superposition is performed on the one hand by applying a so-called phase (encoding) gradient in a phase encoding period following RF excitation, in which spatially dependent phase modification of the precession movement occurs, on the other hand by application of a readout gradient during signal readout, resulting in spatially dependent modulation of the precession frequency. Both encodings are usually performed according to an encoding scheme that permits determination of the spatial distribution of the magnetic resonance signals by means of a Fourier transformation.

In backprojection imaging, the spatial encoding in two or three dimensions is performed solely by frequency encoding by variation of the orientation of the readout gradient in each encoding step.

The spatially selective excitation is a widespread technique in magnetic resonance imaging, which is used to spatially limit the transverse magnetization produced during excitation and/or to spatially vary its amplitude and phase in the excitation volume. In slice selection, which is the most frequent case of selective excitation, the excitation volume is reduced to a defined slice. Also in volume-selective MR spectroscopy (VSS), selection of a region under examination—usually small in relation to the object under examination—is usually based on slice-selective excitation and refocusing pulses, with the spatial selection being performed successively in one spatial direction at a time by means of a corresponding gradient pulse.

To speed up multiple slice acquisitions, MRI and MRS methods have also been developed in which, in multiple phase encoding steps, multiple essentially parallel slices are simultaneously excited with different phase encoding, their magnetic resonance signals are acquired, and the signals are assigned to the relevant excitation slice by means of suitable data reconstruction, e.g. a Hadamard transformation [9].

The multidimensional selective excitation by means of multidimensional RF pulses [10, 11, 12], in which the excitation volume is limited in more than one direction or the excitation is modulated in more than one direction, has also given rise to numerous applications. Noteworthy examples in this case include the excitation of a small three-dimensional volume or multiple volumes simultaneously within a much larger object under examination for localized spectroscopy, the imaging of a selectively excited region of interest (ROI) with a reduced field of view (FOV) for the purpose of reducing the measurement time, the excitation of special volumes adapted to the structures of the object under examination, and echo-planar imaging with reduced echo train lengths. The amplitude and phase modulation in the excitation can also be used to compensate for disadvantageous effects of an inhomogeneous $B_1$ field of the RF antennas used for transmission. This is an application that has become immensely more important because of the large increase in high-field MRI systems [12, 13].

MRI and MRS methods are also known in which nuclear spins are simultaneously selectively excited within one or more spatially separated regions under examination by means of multidimensional RF excitation, and phase encoding is superposed on the magnetic resonance signals during this excitation by means of a suitable encoding scheme. In simultaneous acquisition of the magnetic resonance signals of all regions under examination, this phase encoding permits separation of the signals based on their region of origin and/or determination of their spatial distribution within these regions [14, 15, 16].

For the practical deployment of multidimensional RF pulses, a further aspect of technical progress over the past few years has proven advantageous and is described in detail in [12]. In the past, spatially selective excitation has usually been performed using a single RF transmitter antenna, having an essentially homogeneous transmission field ($B_1$ field), in conjunction with the gradient system. Inspired by the success of parallel imaging, in which signal acquisition is performed with a configuration of multiple RF receiver antennas, also termed antenna array in the specialist literature, one has passed on to now use such arrays for transmission in selective excitation as well. This makes it possible to partially replace the spatial encoding of the excitation locations, which is implemented in selective excitation by variation of gradient fields by analogy with acquisition, by so-called sensitivity encoding and thereby to reduce the length of the excitation pulses. This means that information is used that is contained in the different spatial variations of the transmission fields of the individual array elements, hereinafter also referred to as transmission profiles [17, 18].

One of the basic issues in the use of spatially selective excitation is determination of the RF pulses that have to be played out by the transmitter antenna equipment to generate the desired excitation pattern in conjunction with the k-space trajectory produced with the gradients. In [10], Pauly et al. describe a method for one-channel spatially selective excitation in which, because of a mathematical analogy of selective excitation with Fourier imaging, the sought pulse shape $B_1(t)$ can be essentially calculated by Fourier transformation of the desired excitation pattern and sampling of the Fourier transformation along the defined k-space trajectory. Katscher et al. extended this calculation method to an antenna array having multiple independent transmission channels [17].

In addition to these methods of selective excitation that are characterized by the fact that, during excitation of the nuclear spins by RF pulses, gradient pulses with a spatially encoding effect are simultaneously applied, techniques have also been developed in which, without the additional effect of gradient fields, spatial amplitude and/or phase modulation of the transverse magnetization is achieved by pure superposition of accordingly designed RF pulses that are irradiated simultaneously using at least two transmitter antenna elements [19, 20, 21].

In magnetic resonance imaging and in spatially resolved magnetic resonance spectroscopy, gradient fields that rise or fall monotonically in one spatial direction in the entire volume under examination of the nuclear resonance apparatus are usually used for spatial encoding of the magnetic resonance signals. Because of this property of covering the entire volume under examination, these gradient fields are termed global gradients and the generating system component is termed a global gradient system. Moreover, to simplify representation in the following description, it is assumed that the basic field is oriented in the z-direction of a magnet-bound coordinate system and that the gradient fields can be switched in three variants $G_{gx}$, $G_{gy}$, and $G_{gz}$, whose z-components essentially increase linearly in mutually orthogonal directions with a settable strength [7, 8].

The application of the strongest possible gradients, that is, the formation of the greatest possible magnetic field difference between the edges of the imaging region provides considerable advantages including the implementation of very high spatial resolution. The fastest possible switching response when these gradients are switched on and off and when the gradient strength is set is also advantageous, for example, to shorten the total measurement process.

It is a disadvantage in the deployment of global gradients that the gradient strengths required for typical applications correspond to considerable magnetic field differences between the edges of the imaging region. Their implementation reaches the technical limits of gradient coil design and of dimensioning of the gradient amplifiers with respect to the magnitude and the switching response of the electrical currents to be generated by the gradients coils. Moreover, quickly varying Lorentz forces occur during fast switching of these magnetic fields that can disadvantageously result in very large mechanical stresses on the nuclear resonance apparatus and excessive noise production. A further limitation are neural stimulations in living objects under examination by rapidly varying large magnetic field strengths so that in many cases the image quality that could be technically achieved in principle cannot be implemented in practice because of physiological restrictions re acoustical strain or nerve stimulation.

To avoid these limitations of global gradients, so-called local gradients are introduced. These are usually produced by a local gradient system included in the apparatus in addition to the global gradient system. With such a local gradient system, additional magnetic fields are produced to be used for spatial encoding, wherein for each spatial dimension to be encoded a corresponding variant of the additional magnetic field is implemented with a different respective local gradient $$(\partial B_z(x,y,z)/\partial x, \partial B_z(x,y,z)/\partial y, \partial B_z(x,y,z)/\partial z)$$

of its z-component $B_z(x,y,z)$. As in the case of global gradients, with local gradients each of these variants of the spatially encoding additional magnetic field usually has the property that its z-component $B_z(x,y,z)$ is homogeneously scalable up to a maximum strength in the entire volume under examination. Unlike global gradients, the z-component $B_z(x,y,z)$ of each individual variant of the additional magnetic field of local gradients rises or falls monotonically along the field lines of its gradient field $(\partial B_z(x,y,z)/\partial x, \partial B_z(x,y,z)/\partial y, \partial B_z(x,y,z)/\partial z)$ within only one or several extended and connected subregions of the volume under examination. There is no continuous monotonic progression along these field lines throughout the entire volume under examination. With a variant of such a local additional magnetic field, one-dimensional spatial determination can be performed along the field lines, and components of the acquired magnetic resonance signals can be assigned to individual isosurfaces of the z-component $B_z(x,y,z)$ of the corresponding variant of the additional magnetic field. These magnetic field isosurfaces are locally perpendicular to the field lines and must be known for spatial reconstruction from the magnetic resonance signals. If spatial determination of the magnetic resonance signals is to be performed in multiple spatial dimensions, a corresponding number of suitable variants of the additional magnetic field, hereinafter termed $G_{l1}$, $G_{l2}$, ..., are required and can also be active simultaneously depending on the encoding method. In the case of multidimensional spatial encoding by means of the local gradient system, unique spatial encoding can only be performed in the regions in which all variants of the additional magnetic field therefor used have a monotonic progression, as described above. These regions in which unique spatial encoding can be performed for all the desired dimensions, are hereinafter called MSEM regions.

The advantage obtained from such local gradients is that, within each of these MSEM regions, a spatially encoding magnetic field is produced with a very steep rise and rapid switching response, which can be used to increase the spatial resolution and/or shorten the measurement process. Because the magnetic field difference between the edges of an MSEM region and therefore also the magnetic field variation within the entire volume under examination can be kept much smaller than in the case of global gradients, the disadvantages stated above of large magnetic field variations over time within the nuclear resonance apparatus are greatly reduced or avoided.

If magnetic resonance signals from the entire volume under examination are spatially encoded using such a local gradient system, globally unique spatial assignment based on this spatial encoding is generally not possible in the event of non-spatially selective signal generation or acquisition. In the case of a single MSEM region, it cannot be ascertained which portion of the signal originates from that region and which portion from outside of the region; in the case of multiple MSEM regions, it is furthermore generally not possible to distinguish which signal components originate from which of these MSEM regions. In the case of a single MSEM region, this problem is usually solved by deploying excitation and/or receiver antennas with limited spatial sensitivity, in particular, surface coils, so that only magnetic resonance signals within this MSEM region are excited and/or measured. In the case of local gradient systems that have multiple MSEM regions, unique assignment of the signals is achieved by deploying an antenna array with at least as many suitably disposed elements of different sensitivity, enabling unique assignment as described in [1] to [6]. This may require a complex reconstruction method, for example, a SENSE-like reconstruction [3] to [6].

The disadvantage of this prior art is firstly the necessity to use RF coils or coil arrays with limited sensitivity profiles, given that with the number of MSEM regions the number of receiver elements and channels increases accordingly, making the apparatus much more complex. Moreover, the image reconstruction method is very complex and can result in image artifacts under non-ideal measuring conditions. Because the coils used have especially high sensitivity for object regions near to the surface and much reduced sensitivity for low-lying regions, the methods of prior art are unsuitable for selection of MSEM regions that are removed from the surface.

Using these methods in conjunction with techniques of parallel imaging [7] results in the disadvantage that the potential of the multi-element receiver coils to shorten the measurement time can only be exploited to a limited degree because part of the additional measurement information first has to be used to identify the MSEM region producing the signal. This disadvantage can only be compensated for by a corresponding increase in the number of receiver elements and channels, that is, by more complex apparatus.

It is therefore the object of the invention to provide a measurement method and a reconstruction method that, using local gradient systems with a much less complex RF reception configuration, permit unique determination of the spatial distribution of the magnetic resonance signals in the entire imaging region, in particular, that are also suitable for the imaging of MSEM regions that are remote from the surface, and can effectively be deployed in conjunction with parallel imaging techniques.

SUMMARY OF THE INVENTION

This problem is solved by a method according to the independent claim, whereby, in a preparatory step, a phase encoding scheme A with I phase encoding steps is defined for a phase encoding of the N MSEM regions, where $I \geq N \geq 1$; a spatial, complex excitation pattern of the transverse magnetization of the nuclear spins is defined for each of these phase encoding steps according to the phase encoding scheme A, wherein, for amplitude modulation, the amplitudes are set to be identical for each phase encoding step within the imaging region according to a predetermined distribution, for a spatial selection, the amplitudes outside the imaging region are set to zero, and, for phase modulation, the phases within the MSEM regions of the imaging region are set according to the defined phase encoding scheme A, wherein the same phase is defined at every location within a single MSEM region, and the progression over time of the amplitude and phase of the RF pulses irradiated to excite the nuclear spins is calculated for each defined complex excitation pattern of the phase encoding steps according to phase encoding scheme A and for each transmitter element of the transmitter antenna equipment. In the execution step, according to the invention, each encoding step that is executed according to spatial encoding scheme P is performed I times according to phase encoding scheme A, wherein, to excite the nuclear spins for each phase encoding step according to phase encoding scheme A, the RF pulse or pulses calculated for this are applied so that selection of the imaging region and the amplitude modulation and phase encoding according to phase encoding scheme A within the imaging region is performed during excitation of the nuclear spins, but if there is only one phase encoding step, that is, I=N=1, gradients are also applied simultaneously with RF pulse irradiation. In the reconstruction step of the inventive method, the spatial distribution of the magnetic resonance signals is determined for each of the N MSEM regions, and, in the visualization step, the results of the reconstruction are visualized separately for each of the N MSEM regions and/or integrated with reference to a shared reference system.

The invention therefore relates to a method for determining the spatial distribution of magnet resonance signals from an imaging region within the volume under examination of a nuclear resonance apparatus, wherein the spatial encoding is performed in at least one dimension by means of a local gradient system and the additional magnetic field thus produced only permits unique spatial encoding of the magnetic resonance signals in this or these dimensions within one or more restricted regions, the MSEM regions (MSEM=monotonic spatially encoding magnetic field) according to known methods, but neither permits unique marking of all magnetic resonance signals from outside these regions nor differentiation among identically coded magnetic resonance signals from different MSEM regions. Multiple MSEM regions must be defined in such a way that, for each MSEM region, there is at least one further region with at least partially identical local spatial encoding, that is, spatial encoding by means of local gradient systems.

This basic idea of the invention is,

To limit the excitation of the magnetic resonance signals to an imaging region that covers all MSEM regions and only includes these or, furthermore, to an imaging region within these MSEM regions using spatially selective excitation pulses and to modulate the excitation in those regions according to a predetermined spatial distribution with respect to the amplitude of the transverse magnetization thus produced, wherein, for example, the objective of the experiment, shortening the measurement duration, and/or the imaging quality to be achieved provide criteria for this more extensive restriction of the imaging region In the case of distribution of the imaging region to multiple MSEM regions, in which at least partially identical spatial encodings are achieved by means of the local gradient system, to perform spatially dependent phase encoding of the magnetic resonance signals in multiple phase encoding steps during RF excitation, to use this encoding information to split the acquired magnetic resonance signals into signal components each of which can be assigned to one and only one of these MSEM regions (that is, a different phase encoding is superposed in each MSEM region), and to calculate the spatial distribution of the magnetic resonance signals within each MSEM region separately for each of these signal components according to known reconstruction methods and to group them together for the entire imaging region.

Unlike the known methods [1-6] that obtain the information required to determine the MSEM regions from the spatial dependencies of the reception sensitivities of the reception elements and superpose this information on the magnetic resonance signals in the signal read-out period, the inventive method uses the spatial dependencies of the transmission profiles of the RF transmitter elements and/or the global gradient fields for the same purpose and already superposes the spatial information associated with them on the nuclear spin during the excitation period.

Because the two methods are in no way mutually exclusive but are complementary functionalities of the apparatus, in principle, they can be directly combined. Depending on how the nuclear resonance apparatus is equipped, such a combination can be advantageously used for magnetic resonance imaging.

Further variants and further advantageous properties and embodiments are described in the dependent claims.

Excitation of the nuclear spin is preferably performed by means of transmitter antenna equipment with at least two transmitter elements. The greater the number of antenna elements used, the higher the spatial definition of the spatial amplitude and/or phase modulation of the transverse magnetization that can usually be achieved with them. When multidimensional RF pulses are used, increasing the number of transmitter antenna elements enables greater undersampling of the k-space trajectory, thus shortening the duration of the irradiated RF pulses, which is especially advantageous for suppressing measurement errors due to off-resonance and enlarging of the spectral information accessible during measurement.

In an especially advantageous variant of the inventive method, unique spatial encoding is performed by the additional magnetic field of the global gradient system in each of the L dimensions to be mapped in the entire volume under examination, and, in the preparatory step, a k-space trajectory is selected for phase encoding according to phase encoding scheme A that is defined by means of gradient pulses that are generated with the global gradient system, and the progression over time of the amplitude and phase of the RF pulse or pulses irradiated to excite the nuclear spins is calculated for the selected k-space trajectory, and, in the execution step, the calculated RF pulse or pulses are applied as the selected k-space trajectory is traversed. The RF pulses are therefore applied while a k-space trajectory is being traversed, that is, at the same time as gradient pulses are taking effect. These gradient pulses are produced with the global gradient system and implement a k-space trajectory that is defined in the preparatory step and for which the progression over time of the amplitude and phase of the RF pulse or pulses irradiated to excite the nuclear spins is calculated for each phase encoding step. With this variant, especially good spatial definition of the phase encoding and amplitude modulation during excitation can be achieved, in particular, for measurement using multiple RF receiver elements.

If only one MSEM region exists or if the imaging region is to be restricted to a single connected region, it is advantageous to perform purely spatially selective excitation under the effect of gradients, in particular by using multidimensional RF pulses, because, in this case, it is not necessary to differentiate between different regions, making spatial encoding during excitation unnecessary.

In the case of multidimensional configurations of MSEM regions, it is advantageous if excitation of the nuclear spins is performed with a multidimensional RF pulse. For example, two-dimensional RF pulses can be used for encoding the MSEM regions if the local gradient system is designed for two-dimensional spatial encoding.

In a variant of the invention especially preferred for practical use, the measurements are performed with one-element transmitter antenna equipment, in particular, a volume resonator because this requirement is met in all standard nuclear resonance apparatus.

In the case of use of multidimensional RF excitation pulses, excitation of the nuclear spins is preferably performed by means of transmitter antenna equipment with at least two transmitter elements. This permits an advantageous variant of the inventive method in which undersampling of the k-space trajectory traversed during excitation is performed, which, in turn, provides the decisive advantage of a shortened duration of the irradiated RF pulses. Amongst other, this permits the suppression of measurement errors due to off-resonances and allows enlargement of the spectral information that is accessible during measurement.

A variant especially preferred for the practical use of the inventive method is to perform the measurements of the MR signals with one-element receiver antenna equipment, in particular, a volume resonator because this considerably reduces the complexity of the apparatus.

Advantages with respect to the image quality achieved and shortening the measurement time can be obtained by using multiple RF receiver elements for reception of the MR signals. In particular, these advantages can be used where parallel imaging techniques are deployed.

It is advantageous, e.g. for the technical requirements of the global gradient system, if the k-space trajectory used comprises at least one spiral-shaped component that is traversed from the outside to the inside or from the inside to the outside.

In a further embodiment of this variant, the k-space trajectory used comprises multiple spiral-shaped components that are traversed alternately from the outside to the inside and from the inside to the outside. The advantage of this is the time saved on the transitions between the spiral-shaped components.

It is especially advantageous if, when irradiation with the RF pulse ends, the k-space trajectory used ends at the center of the k-space or in its vicinity, and/or the gradient pulses used attain very small or vanishing amplitudes. This permits minimal delay in the start of data acquisition.

In a further very important variant of the inventive method, the imaging region is adapted to anatomical, morphological, or functional circumstances of the object under examination, so that in this way, for instance, certain regions of the object under examination that can cause disturbances in measurement can be excluded from the excitation. It is also advantageous if the imaging region can be reduced to the minimum necessary size for the measurement task, which generally shortens the measurement time.

Moreover, it can be extraordinarily advantageous for the image quality achieved if the imaging region is adapted to the areas of the MSEM regions with special imaging characteristics, example, with especially high gradient strength.

In one variant of the inventive method, a two-dimensional RF pulse is used for excitation, and spatial selection is performed in a spatial direction that is linearly independent thereof by slice-selective phase refocusing by means of a global gradient. This permits two-dimensional imaging with a local gradient system designed for two dimensions.

Alternatively, a two-dimensional RF pulse can be used for excitation, and the spatial encoding and/or a spatial selection in a spatial direction that is linearly independent thereof is performed via frequency encoding by the effect of a global gradient in this direction during data acquisition. This permits three-dimensional imaging with a local gradient system designed for two dimensions.

According to the invention, the spatial encoding can be performed by means of the local gradient system in one spatial dimension and the spatial encoding according to spatial encoding scheme P is performed by the global gradient system in two spatial directions that are different from the former.

Alternatively, it is also possible for the spatial encoding in two spatial dimensions to be performed by means of the local gradient system and the spatial encoding in one spatial direction that is linearly independent thereof to be performed by the global gradient system.

A further advantage of the inventive method is that the corresponding optimal choice of the encoding scheme A can be made for each number of dimensions spatially encoded by the local gradient system and for each spatial configuration of the MSEM regions. In principle, a one-dimensional encoding scheme A can be used in any case. In the case of two-dimensional spatial encoding by means of local gradients, however, a two-dimensional encoding scheme A can be more advantageous.

Moreover, it is also possible for the spatial encoding to be performed in three spatial dimensions by means of the local gradient system. In this case, depending on the configuration of the MSEM regions, also use of a two- or a three-dimensional encoding scheme A can be preferred.

In special variants of the inventive method, determination of the assignment of the magnetic resonance signals to MSEM regions is performed with the assistance of one-, two-, or three-dimensional Fourier or Hadamard or Wavelet transformation.

It is also possible to define the excitation amplitudes within the imaging region according to a uniform distribution. In this way, distortion of the acquired image due to the transmission characteristics of the transmitter antenna equipment, for example, in the form of local brightening or darkening, can be suppressed.

It can also prove advantageous if, before execution of the phase encoding steps, the nuclear spin system is put into a steady state by repeated traversal of the excitation cycle of the execution step without data acquisition or further use.

It can also be advantageous for the image quality if spoiler gradients are used in each phase encoding step to dephase unwanted residual transverse magnetization.

Further advantages of the invention can be derived from the description and the drawings. The characteristics stated above and further characteristics stated below can be used individually or in any combination. The embodiments shown and described are not intended to be an exhaustive list but are examples used to explain the invention.

DESCRIPTION OF THE PREFERRED EMBODIMENT

Figure 1:
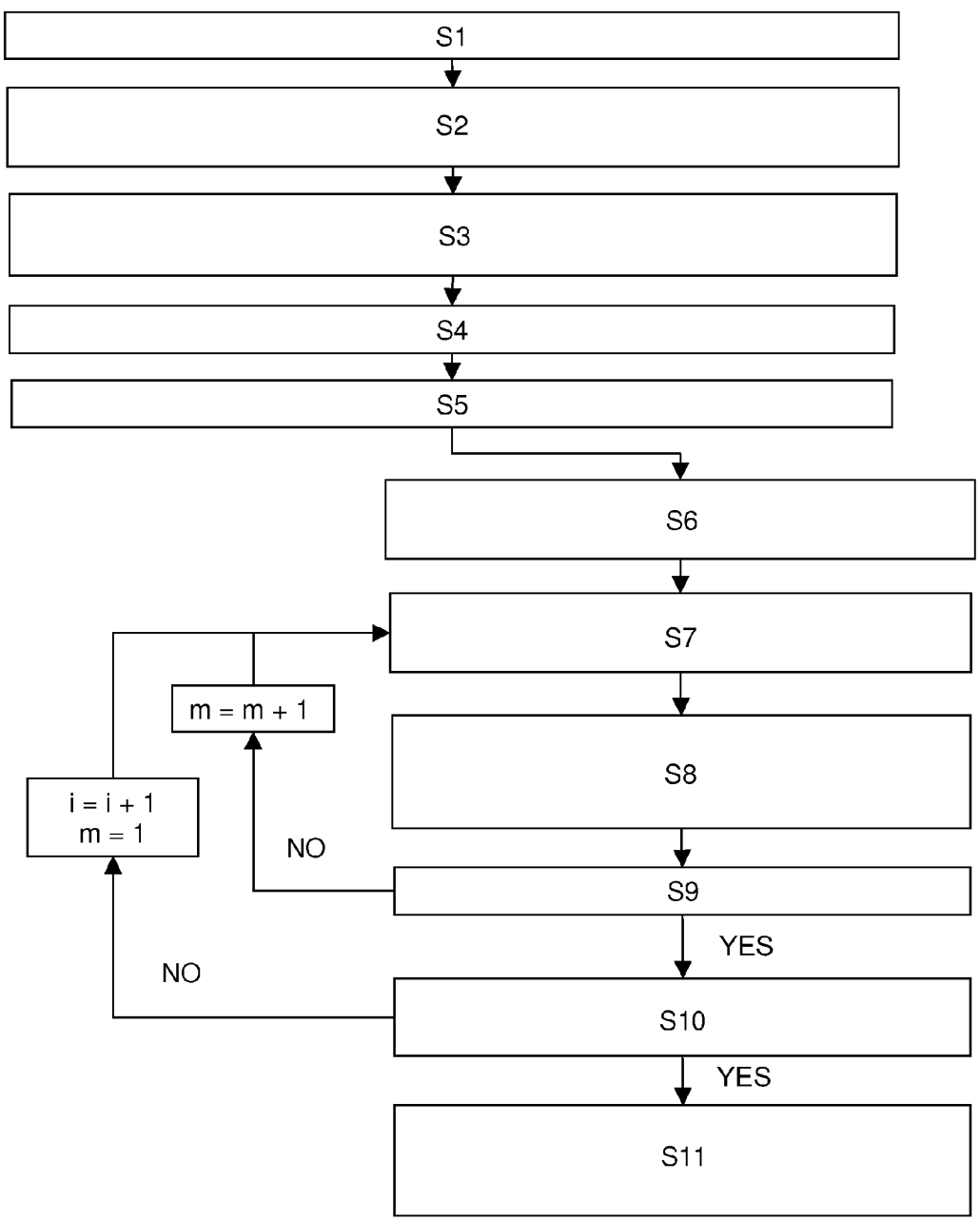
FIG. 1 shows a flowchart of the inventive method with repetition of each individual excitation encoding step in an outer loop.

FIG. 1 shows the inventive method steps, which are described in more detail below. In particular, FIG. 1 illustrates the following method steps:

S1=Selection of the imaging region
S2=Definition of the encoding scheme P for the spatial encoding by local and/or global gradients after excitation
S3=Definition of the phase encoding scheme A for the spatial encoding of the MSEM regions during excitation
S4=Definition of an excitation pattern for each phase encoding step of A
S5=Calculation of the RF pulses for each phase encoding step of A
S6=Initialization and start of a spatially resolving MR measurement with phase encoding step m=1, i=1
S7=Excitation of the object with RF pulse for phase encoding step i
S8=Evolution of the spin system in the object, encoding according to step m of P and acquisition of the magnetic resonance signals
S9=All encoding steps of P traversed?
S10=All excitation phase encoding steps of A traversed?
S11=Completion of the measurement, data reconstruction, storage and/or visualization.

In the inventive method, the imaging region is defined first. The union of all N MSEM regions based on knowledge of the characteristics of the local gradient system used can define the maximum extent of this imaging region. This maximum possible imaging region can then be restricted, for example, by user interactions based on a conventionally acquired MR pilot image on which the MSEM regions are marked, or by automated settings. An essential criterion for this limitation is the objective of the examination, that is, it is enough only to image the regions that are important for the objective of the examination. Since the measurement duration for a certain desired spatial resolution can be shortened by reducing the imaging region, this focusing option is a major advantage of the invention. Because as a rule, an inhomogeneous spatial resolution is achieved in the MSEM regions due to the non-linear progression of the magnetic fields $G_{l1}$, $G_{l2}$, ... there, measurement can be limited to the regions with the highest resolution by means of the limitation of the imaging region, which is very advantageous, for example, for the local gradient systems described in [4] and [5].

In a preparatory step, a spatial encoding scheme P with M encoding steps, $M \geq 1$, is defined for this imaging region that is based on gradient pulses that can be generated with the local and/or the global gradient system, but in at least one dimension by means of local gradients. For example, this can be one of the known encoding schemes of classic spin-warp imaging, of fast echo train imaging, of projection imaging, or of parallel imaging [7]. In this preparatory step, a phase encoding scheme A with I phase encoding steps, $I \geq N \geq 1$ is defined for phase encoding of the MSEM regions during excitation. For each of these phase encoding steps, a spatial, complex excitation pattern of the transverse magnetization is determined, in which the amplitudes within a defined imaging region are set according to a predetermined distribution, for example, according to a uniform distribution, identical for each phase encoding step, and the amplitudes outside the imaging region are set to zero. The phases of the transverse magnetization are set, within the imaging region, according to phase encoding scheme A in such a way that all locations within the same MSEM region receive the same phase encoding. To complete this preparatory step, the progression over time of the amplitude and phase of the RF pulses to be irradiated for excitation is calculated for each complex excitation pattern of the phase encoding steps of phase encoding scheme A for each transmitter element of the transmitter antenna equipment.

Figure 2:
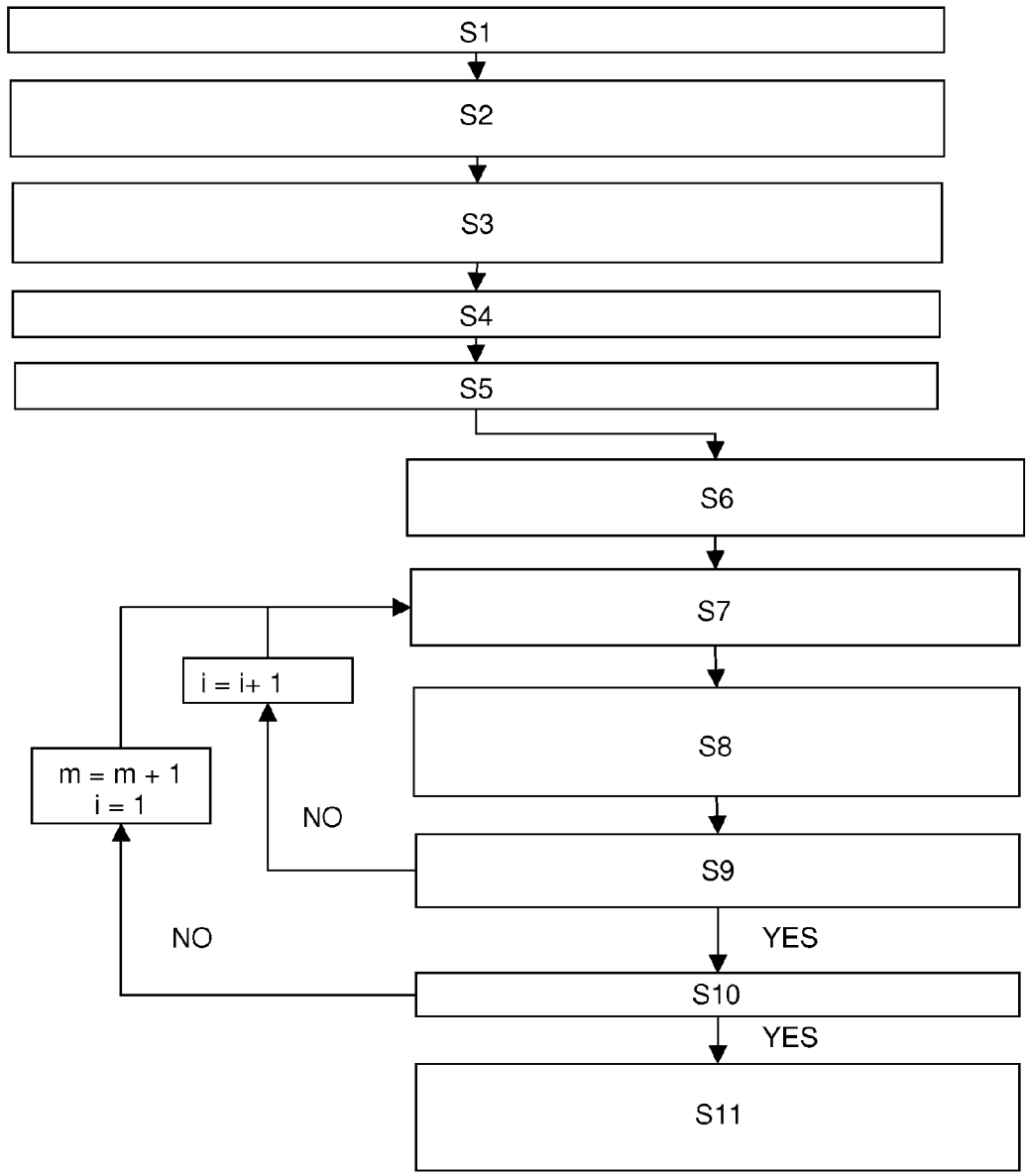
FIG. 2 shows a flowchart of the inventive method with repetition of each individual excitation encoding step in an inner loop.

In the execution step, all spatial encoding steps of the spatial encoding scheme P are traversed and this sequence, as described in FIG. 1, is repeated for all phase encoding steps of the phase encoding scheme A. Alternatively, these execution loops can be traversed nested the other way round, as is shown in FIG. 2. In particular, FIG. 2 illustrates the following method steps:

S1=Selection of the imaging region
S2=Definition of the encoding scheme P for the spatial encoding by local and/or global gradients after excitation
S3=Definition of the phase encoding scheme A for the spatial encoding of the MSEM regions during excitation
S4=Definition of an excitation pattern for each phase encoding step of A
S5=Calculation of the RF pulses for each phase encoding step of A
S6=Initialization and start of a spatially resolving MR measurement with phase encoding step m=1, i=1
S7=Excitation of the object with RF pulse for phase encoding step i
S8=Evolution of the spin system in the object, encoding according to step m of P and acquisition of the magnetic resonance signals
S9=All excitation phase encoding steps of A traversed?
S10=All encoding steps of P traversed?
S11=Completion of the measurement, data reconstruction, storage and/or visualization.

The individual phase encoding steps of phase encoding scheme A differ in that the RF pulses calculated for the respective phase encoding step are applied during the excitation period. After RF excitation, in each encoding step, that is, on each traversal of the inner loop, spatial encoding is performed by means of the local and/or global gradient system, but at least in one dimension by means of local gradients, and acquisition of the magnetic resonance signals is performed with RF receiver antenna equipment.

If a multidimensional phasing coding scheme A is used in which, in the execution step, the I encoding steps are traversed in a corresponding number of loops nested within one another, execution can be implemented in flow structures for traversing all M*I encoding steps that are much more complex than those shown in FIGS. 1 and 2. Similarly, this also applies to multidimensional encoding schemes P and, in particular, if phase encoding scheme A and spatial encoding scheme P are both multidimensional. Restructuring options for such flow structures are known to magnetic resonance specialists.

In the reconstruction step, the acquired signals are split into components, for example, by means of Fourier transformation, which are assigned to just one MSEM region each, and for each MSEM region, the spatial distribution of the magnetic resonance signals is determined for the selected spatial encoding scheme P according to known methods, such as are described in [7], wherein the sequence of these spatial assignments is generally not important. In particular, if a multidimensional phase coding scheme A is used for excitation encoding, assignment of the MSEM region and calculation of the spatial distribution for each dimension can be performed, one nested within the other.

If multiple receiver elements are used for parallel data acquisition, the known reconstruction techniques of parallel imaging [7] can be used within the individual MSEM regions.

Finally, in a visualization step, the results of reconstruction and/or quantities derived therefrom are stored and visualized. Two- or three-dimensional images rendering certain characteristics of the magnetic resonance signals are preferably displayed with color or grayscale coding. Integrated visualization of all MSEM regions with reference to a common reference system is especially interesting.

The inventive method is especially interesting in the case of multiple MSEM regions, that is, where $N \geq 2$, and hence multiple phase encoding steps that is, $I \geq 2$ because this variant can be used very advantageously for highly resolved imaging of extensive structures when complex local gradient systems are used.

A somewhat more detailed account of several important aspects and variants in the performance of the inventive method and special advantages follow below.

Figure 5:
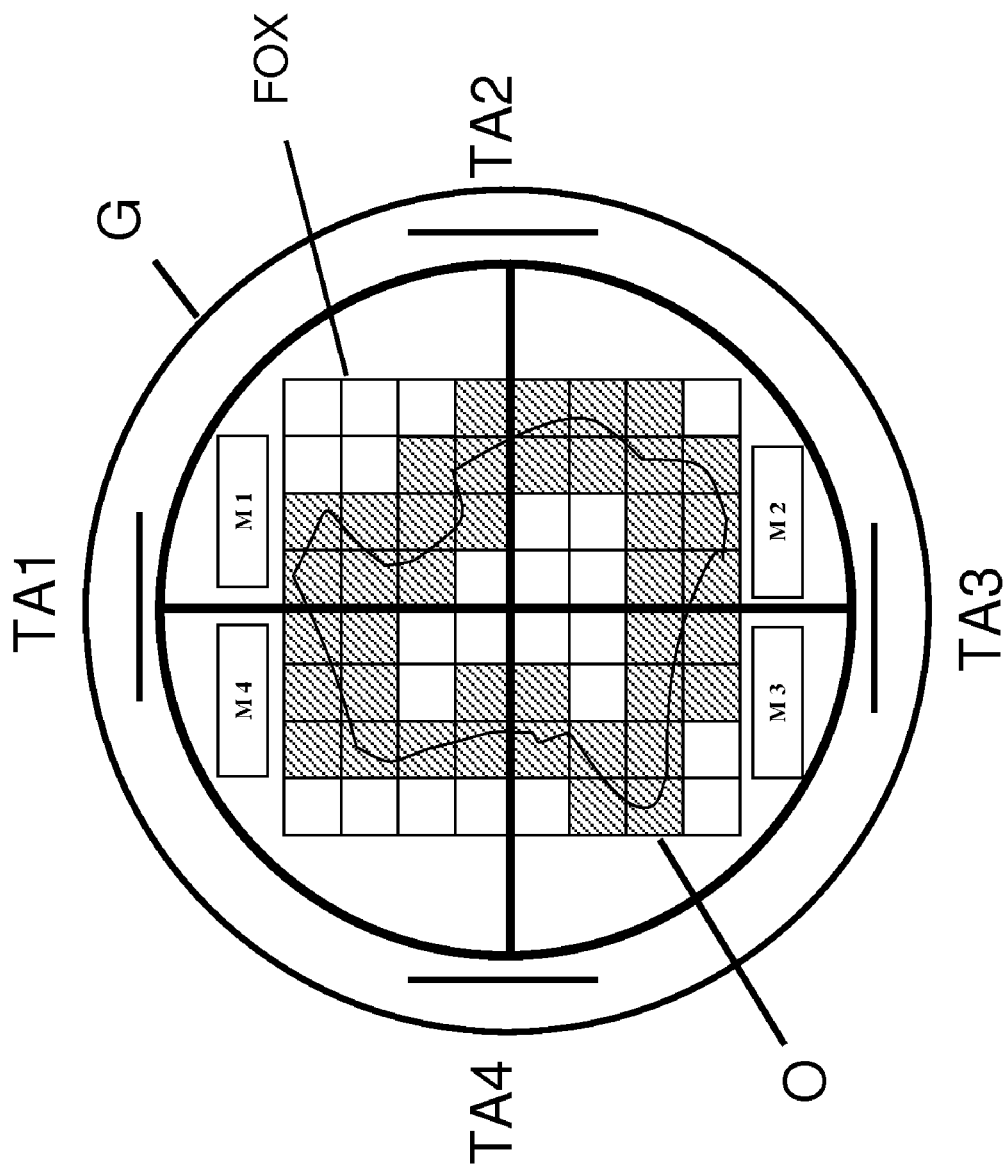
FIG. 5 shows a schematic diagram for defining the imaging region and the phase encoding scheme from FIG. 1.
Figure 6:
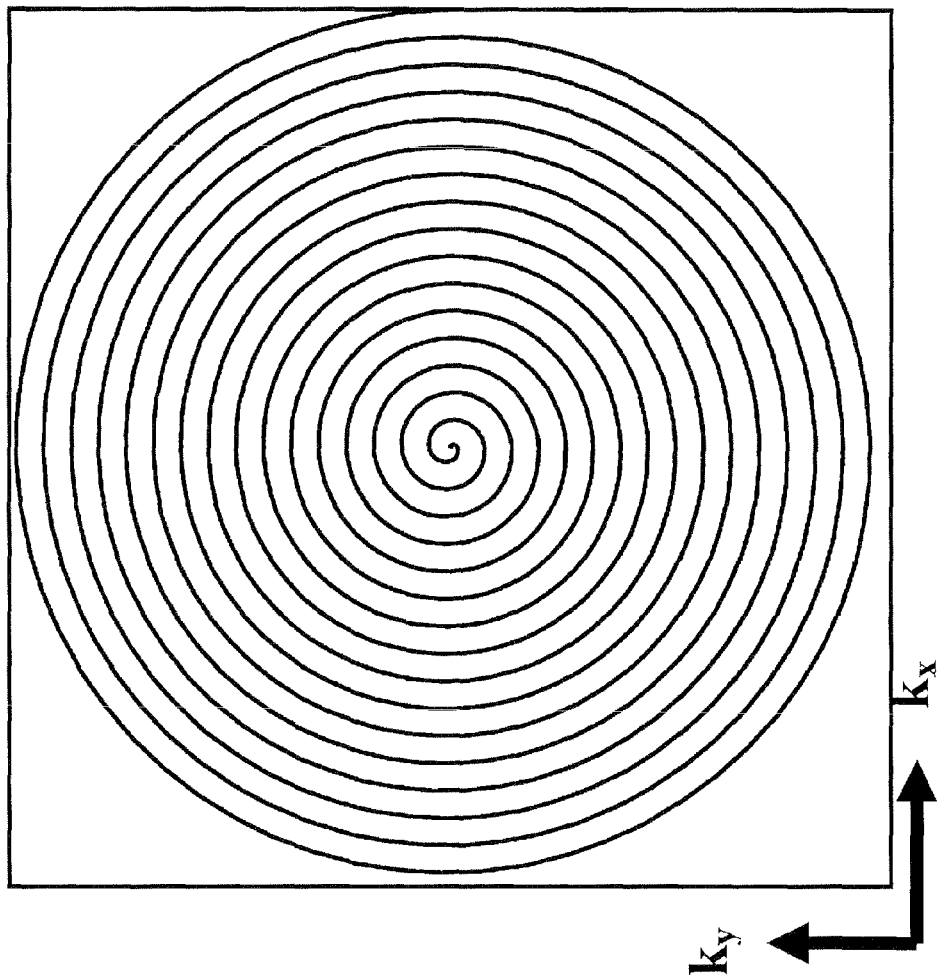
FIG. 6 shows a schematic diagram of a spiral-shaped k-space trajectory that is advantageous for excitation.
Figure 7:
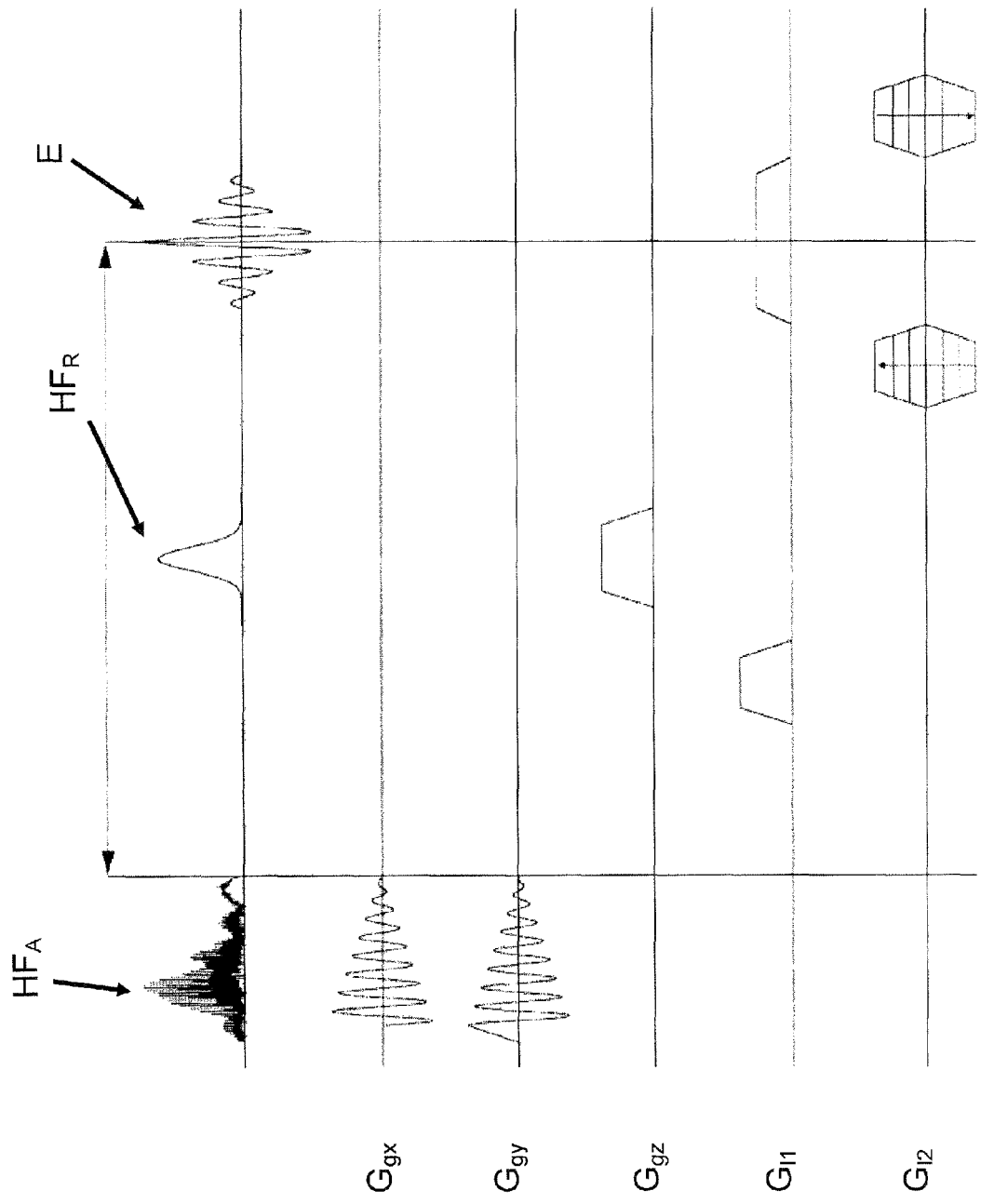
FIG. 7 shows a schematic diagram of a measurement sequence suitable for performing a single inventive excitation phase encoding step.

One very important variant of the inventive method is based on the principle of using a multidimensional RF pulse for superposing not only a spatial selection and amplitude modulation, but also a spatial phase distribution on the nuclear spins during excitation. In implementation of this variant, the following procedure is advantageous [15]:

For definition of the measurement, a field of excitation (FOX) that covers the object under examination, any resolution grid inscribed in this field of excitation, and a k-space trajectory coordinated with this are defined (see FIG. 5). Preferred k-space trajectories are 2-dimensional spirals that are traversed from the inside to the outside or vice versa, and stacks of spirals oriented in parallel. Trajectories are advantageous which, when irradiation of the RF pulses ends, end at the center of the k-space or in its vicinity, and/or attain very small or disappearing amplitudes for the gradient pulses used. In these cases, initiation of the ensuing spatial encoding can be minimally delayed.

Within the defined resolution grid, the desired imaging region is first defined and the encoding cells, for which a certain phase encoding is to be performed, are defined in accordance with this imaging region. Such an encoding cell corresponds to all cells of the resolution grid that are located inside a single MSEM region and inside the imaging region.

Based on these specifications, phase encoding scheme A is defined for the encoding cells, and phase encoding scheme A also defines which phase each encoding cell is to have in the different phase encoding steps. For the preferred reconstruction methods, the number of phase encoding steps is selected in accordance with the number of encoding cells. For each phase encoding step and for each encoding cell, a relative excitation phase is defined in accordance with the selected phase encoding scheme A. Based on this, for each phase encoding step, a complex excitation pattern is defined, that is, the amplitude and phase are defined for each cell of the resolution grid within the excitation region. In the simplest case, the excitation cells receive the phases defined for each phase encoding step and a constant amplitude coordinated with the flip angle to be generated. For the remaining resolution grid cells, the amplitude is set to 0 for all phase encoding steps within the excitation pattern. If, during excitation, spatial modulations are to be superposed on the amplitude of the transverse magnetization to be achieved, for example, known B1 inhomogeneities of the antenna transmitter fields are compensated for, a corresponding amplitude distribution in the resolution grid cells must be defined that remains identical for all phase encoding steps.

For the selected k-space trajectory, for each defined complex excitation pattern, according to which excitation is performed during a phase encoding step, and for each transmitter element of the transmitter antenna equipment, the progression over time of the amplitude and phase of the radio frequency to be irradiated over each transmitter element is determined according to known calculation methods, for example, according to [22] or [23], and the magnetic gradient pulses corresponding to the selected k-space trajectory are determined. The use of multiple-element transmitter antenna equipment in conjunction with simultaneous irradiation with generally different RF pulse waveforms over the various transmitter elements, achieving shortening of the k-space trajectory by undersampling, has the advantage that the excitation duration is reduced accordingly, and measurement artifacts caused by off-resonances can be significantly suppressed. Similarly, this enlarges the bandwidth of the RF pulses and therefore also the spectral information accessible for measurement.

During execution of the magnetic resonance measurements, a sequence of phase encoding steps is executed, wherein in each phase encoding step a multidimensional RF pulse is irradiated initially as the defined k-space trajectory is traversed. The k-space trajectory is traversed by running the global gradient pulses calculated for this, while at the same time the radio frequency is irradiated over all transmitter elements of the transmitter antenna equipment with the respective precalculated amplitude and phase progressions. In this way, the nucleus magnetization in the resolution grid is excited in accordance with the excitation pattern of the phase encoding step in question and is spatially encoded within the imaging region in accordance with the phase encoding scheme. The signal encoded in this way is acquired after subsequent further encoding according to the spatial encoding scheme P with receiver antenna equipment.

In selecting the phase encoding scheme A, it is important to ensure that it permits adequate spatial mapping fidelity and resolution for the particular application under real experimental conditions. For example, there are certain options, in particular, with respect to the dimensionality of the phase encoding scheme A used. A three-dimensional imaging region can be encoded with a three-, two-, or one-dimensional phase encoding scheme A; a two-dimensional imaging region, with a two- or one-dimensional phase encoding scheme A and be reconstructed accordingly. However, the phase encoding scheme A is preferred whose dimension corresponds to the MSEM structure and whose use avoids small deviations in the phase definition resulting in sudden changes of the locations reconstructed from the phase values actually realized during excitation.

A major advantage of the invention is that the imaging region can be very well adapted to the region or regions that are of interest for spatially resolved examination within the object under examination, for example, because of its anatomical, morphological, or functional circumstances. This adaptation option also permits the exclusion of certain regions of the object under examination that could cause disturbances in the measurement, for example, pulsating blood vessels in the case of in-vivo examinations.

Moreover, restriction of the spatial encoding to the imaging region can have advantages for the measurement time required because of the associated reduction in number of encoding steps of the spatial encoding scheme P, in particular, if this imaging region is very small compared with the dimensions of the object under examination and is to be examined with high spatial resolution. That is, the inventive method provides an efficient way of performing magnetic resonance microscopy of interior structures of an extended object under examination.

Figure 3:
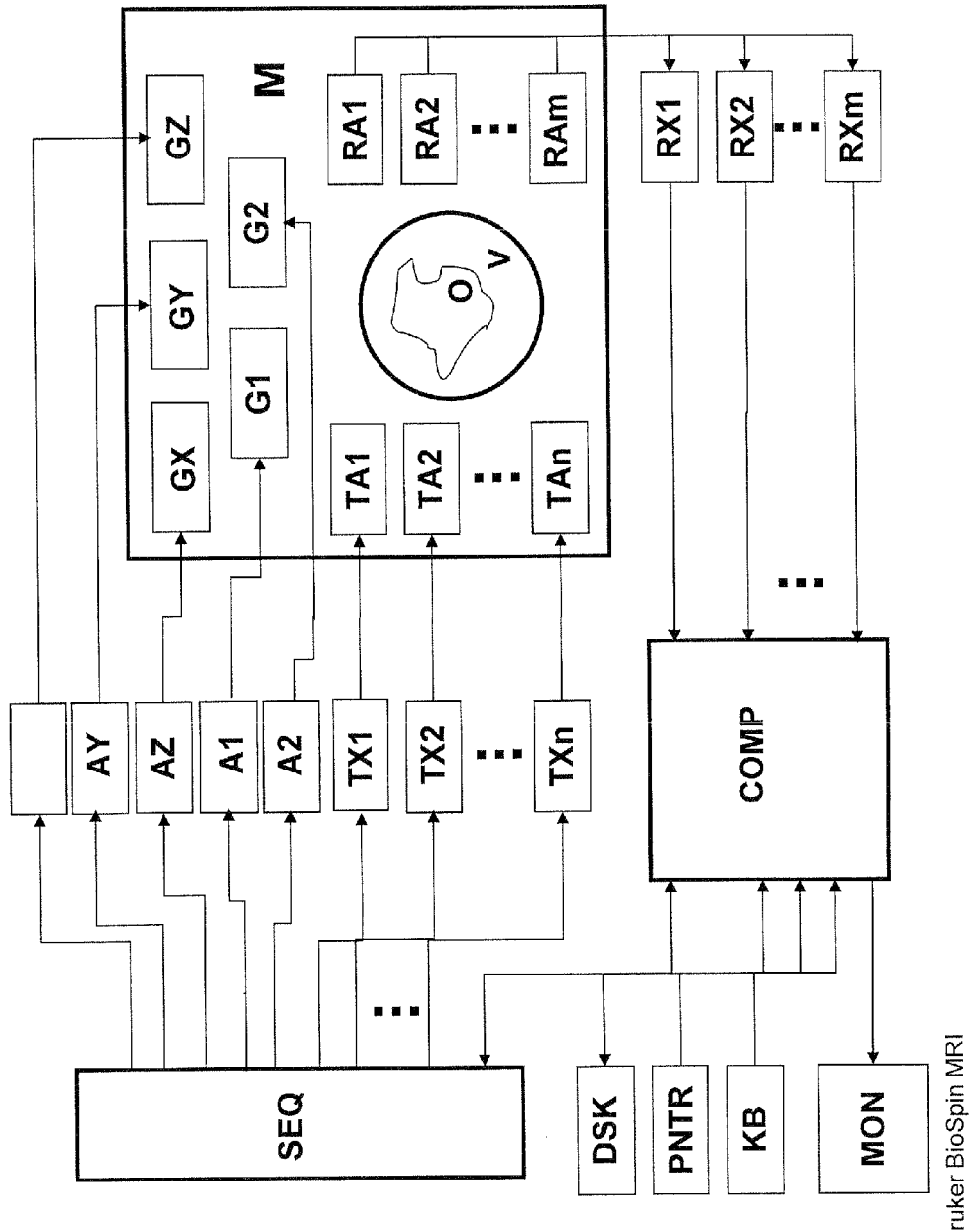
FIG. 3 shows a schematic diagram of an MR measurement system that is suitable for performing the inventive method.

FIG. 3 schematically shows an MR measurement system that is suitable for performing the inventive method. The system contains the main magnet M, with which the essentially homogeneous and static basic magnetic field is produced in a volume under examination V. Placed within the bore of the main magnet M, enclosing this volume under examination V, there are a global gradient system, which comprises three sets of gradient coils GX, GY, and GZ, and a local gradient system, with which different variants of local additional fields, local gradients, can be implemented, usually by switching multiple coils to form coil combinations G1, G2. Global and local gradient systems do not have to be implemented as separate instruments but may access shared gradient coils. As an example, FIG. 3 shows 2 such coil combinations, G1 and G2. In both gradient systems, additional magnetic fields with controllable duration and strengths can be superposed on the basic field. With gradient amplifiers AX, AY, AZ, A1, and A2 that are controlled by a sequence control unit SEQ to produce gradient pulses at the right instant, the gradient coil sets GX, GY, GZ, G1, and G2 are supplied with electric power to produce the additional fields.

Within the gradient field system, there are multiple transmitter elements, TA1 to TAn, that are together termed the transmitter antenna equipment. They surround an object under examination O and are fed by multiple independent RF power transmitters TX1 ... TXn. The RF pulses produced by these RF power transmitters TX1 ... TXn are determined by the sequence control unit SEQ and triggered at the correct time. With the transmitter elements TA1 to TAn, the RF pulses are irradiated onto the object under examination O in the volume under examination V, where they excite nuclear spins. The magnetic resonance signals thereby caused are converted into electrical voltage signals with one or more RF receiver elements RA1, ..., RAm, and are then fed into a corresponding number of receiver units RX1, ..., RXm. The receiver elements RA1, ..., RAm are together termed the receiver antenna equipment consisting of m receiver elements RX1, ... RXm. They are also located within the gradient coils GX, GY, GZ, and surround the object under examination O. To reduce the complexity of the apparatus, the transmitter and receiver antenna equipment can be designed and connected in such a way that one or more of the transmitter elements TA1 to TAn are also used to receive the magnetic resonance signals. In this case, which is not shown in FIG. 3, switchover between transmission and reception modes is assured by one or more electronic transmission-reception switches controlled by the sequence control unit SEQ, that is, that during the RF transmission phases of the executed pulse sequence, this antenna or these antennas are connected with the corresponding RF power transmitter or transmitters and disconnected from the allocated receiver channel or channels, while, for the reception phases, transmitter disconnection and receiver channel connection is performed. With the receiver units RX1 to RXm shown in FIG. 3, the signals received are amplified and converted to digital signals using known signal processing methods and passed on to an electronic computer system COMP. In addition to reconstruction of images and spectra as well as derived quantities from the measured data received, the control computer system COMP is used to operate the entire MR measurement system and to initiate execution of the pulse sequences by appropriate communication with the sequence control unit SEQ. User-guided or automatic execution of programs for adjusting the measurement system characteristics and/or for generating magnetic resonance images is also performed by this control computer system COMP, as are visualization of the reconstructed images and storage and administration of the measurement and image data and control programs. For these tasks, this computer system is equipped with at least a processor, a working memory, a computer keyboard KB, a pointing device PNTR, for example, a computer mouse, a monitor MON, and an external digital storage unit DSK.

A preferred embodiment is explained below based on FIGS. 4 to 7. This includes acquisition of a two-dimensional image of the magnetic resonance signals of a thin slice of an object under examination. The two-dimensional spatial encoding within this slice is performed by excitation with two-dimensional RF pulses followed by phase and frequency encoding by means of local gradients and slice selection by means of refocusing pulses under the influence of a global gradient that is orthogonal with respect to this slice.

Figure 4:
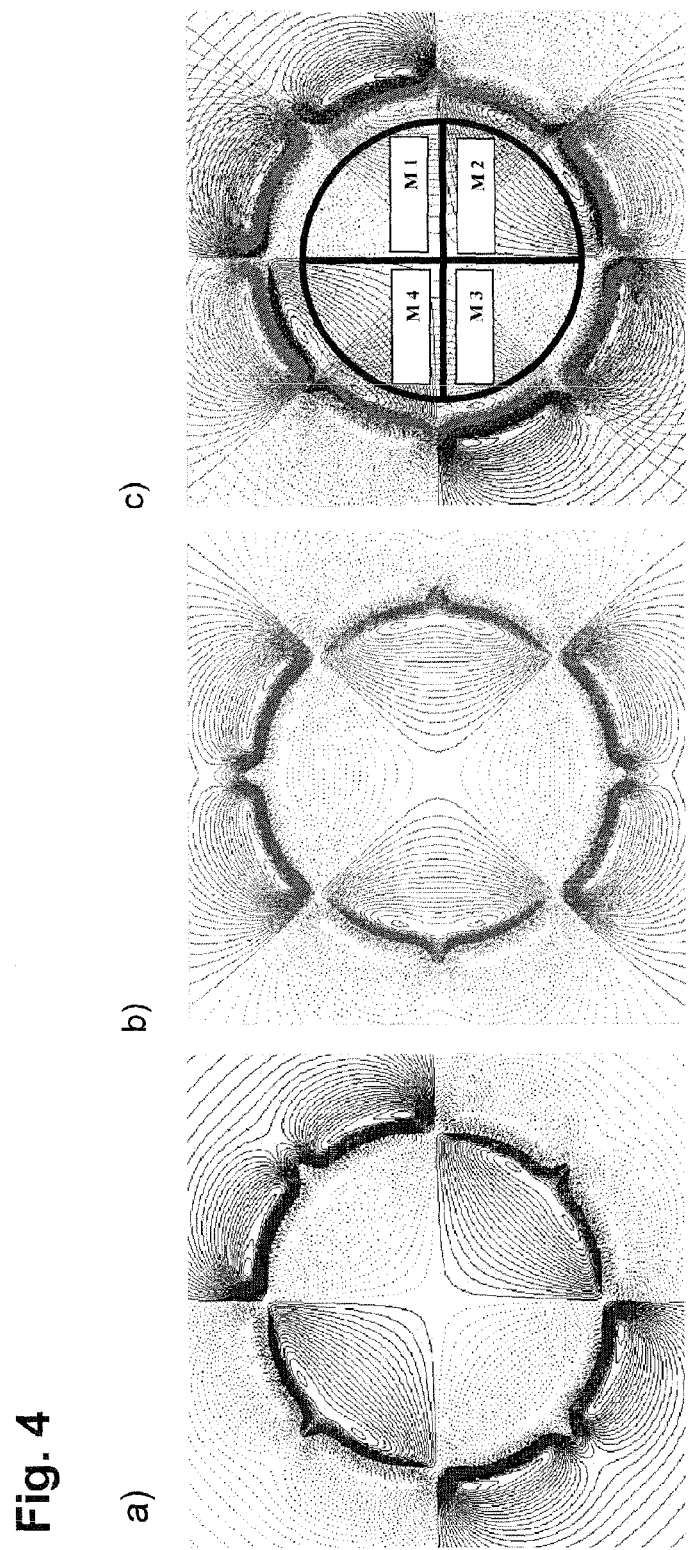
FIG. 4a-c shows schematic diagrams of the isomagnetic field lines and MSEMs of an octagonal gradient system.

FIG. 4 initially shows the field dependence of the local gradient system used in this example and the MSEM regions thereby defined. It is the octagonal gradient system described in [5] with which two variants of a 4-pole magnetic field can be produced. FIG. 4a schematically shows the isomagnetic field lines of the variant used for phase encoding; FIG. 4b, that of the variant used for frequency encoding. The absolute value of both fields decrease toward the center, where the field progression is flat with poor spatial encoding characteristics. The isolines for positive values of the field component $B_z$ are shown continuous; those for negative values are shown dotted. In FIG. 4c, these $B_2$ isolines of both variants are shown superposed and the 4 MSEM regions resulting from them that each correspond to a quadrant in the cross-section of the volume under examination are indicated. To illustrate the further procedure, these regions are schematically drawn again in FIG. 5 together with the gradient tube of the local gradients and four transmitter antennas with which the RF pulses are irradiated. Otherwise the measurement apparatus corresponds to the configuration described in FIG. 3.

To plan the measurement, a pilot image of a section through the object under examination is first acquired using a conventional magnetic resonance imaging technique. Based on this pilot image, a field of excitation FOX is selected that covers the entire object under examination O, as is shown in FIG. 5. The field of excitation FOX is superposed by an orthogonal resolution grid with 8×8 square resolution grid cells over its entire area (see FIG. 5). This resolution grid corresponds to the cells of the excitation pattern of the transverse magnetization, that is, it defines the spatial resolution with which this excitation pattern is to be implemented. Within the field of excitation FOX, an imaging region is now defined that is to be imaged by the experiment. The imaging region is a subregion of the field of excitation FOX and, in this embodiment, is defined by the fields of the resolution grid drawn hatched in FIG. 5. In this example, the primary aim is to examine the regions of the object O that are near to the surface. For this reason, the central regions of the object are not included in the imaging region. This saves phase encoding steps in the spatial encoding scheme P and limits measurement to the regions with strong local gradients.

Because the intention is to use a two-dimensional RF pulse for MSEM encoding, a k-space trajectory adapted to the problem is selected as part of the experiment planning. For this two-dimensional case, a spiral-shaped k-space trajectory is suitable, as is shown schematically in FIG. 6, which is traversed from the outside to the inside during the experiment by appropriate switching of global gradient pulses.

In the following definition step, the phase encoding scheme A for the spatial encoding during excitation is defined. Of the resolution grid cells of the resolution grid located within the imaging region, in this example, all cells located in the same MSEM region are grouped together to form an encoding cell, with all resolution grid cells of one encoding cell receiving the same phase encoding in each phase encoding step during excitation encoding A. For these encoding cells, a one-dimensional phase encoding scheme is defined with 4 phase encoding steps, which later enables MSEM region assignment by means of a one-dimensional Fourier transform. For each phase encoding step, a complex excitation pattern must be defined, that is, the amplitude and phase must be defined for each of the 8×8 resolution grid cells. All resolution grid cells outside the imaging region, that is, the fields not hatched in FIG. 5, receive an amplitude value of 0 for all phase encoding steps, while all resolution grid cells located in the imaging region, that is, the hatched fields in FIG. 5, receive the same amplitude that is identical for all phase encoding steps and is calculated from the flip angle desired for the excitation pulse according to known methods [7]. The resolution grid cells assigned to the kth encoding cell receive the following phase value for the ith (of I) phase encoding step:

$$\varphi_i^k = 2\pi \cdot \left( \frac{k \cdot i}{I} \right)$$

where k=0, . . . , (I−1) and i=0, . . . , (I−1). I denotes the number of phase encoding steps, where I=4 in the described embodiment.

To prepare the experiment, the gradient and RF pulses to be applied are calculated. The gradient pulses are determined according to known methods, such as are described in Section 17.6 in [7]. FIG. 5 shows the object under examination O, which is surrounded by transmitter antenna equipment with four transmitter elements TA1, TA2, TA3, TA4 and a gradient system G. For each phase encoding step, a complex RF pulse waveform is calculated from the corresponding excitation pattern for each of the four transmission channels. The method of Yip [22] and Grissom [23] respectively is applied. That is, by solving a matrix equation that connects the excitation pulses with the excitation pattern via a transition matrix that depends, amongst others, on the determined transmission profiles of the transmitter elements TA1, TA2, TA3, TA4 and the selected k-space trajectory, the amplitude and phase progressions of the four RF pulse waveforms to be applied simultaneously are calculated.

In performing the experiment, a sequence of four phase encoding steps for excitation encoding is executed according to the control flow described in FIG. 1. As described in the measurement sequence diagram in FIG. 7, after irradiation with the RF pulse waveforms of RF pulse $HF_A$ via the four transmitter elements TA1, TA2, TA3, TA4, calculated for each phase encoding step, with simultaneous effect of global gradient pulses $G_{gx}$, $G_{gy}$, that implement the defined k-space trajectory, a slice-selective refocusing is performed with a time delay TE/2 by means of a 180° RF pulse $HF_R$ during application of a global slice-selection gradient $G_{gz}$, that is applied orthogonally with respect to the gradient pulses $G_{gx}$, $G_{gy}$ of the two-dimensional RF pulse. This is followed by phase encoding by means of the local phase gradient $G_{l2}$ and then, after a time delay TE after the end of the excitation pulse, an echo signal E is read out with application of the local readout gradient $G_{l1}$.

During performance of the experiment, for each encoding step of the encoding scheme P, 4 data sets are acquired that correspond to the 4 phase encoding steps of the phase encoding scheme A. For each 4-tuple of corresponding complex data points within these data sets, a one-dimensional discrete Fourier transformation is performed, thus generating 4 new data sets of complex data points. The data of such a single reconstructed data set now describe the proportion of the measured 4 magnetic resonance signals that can be assigned to one and no more than one of the 4 MSEM regions. If this reconstruction is performed for all acquired data, 4 complete raw image data sets are obtained, from which for each MSEM region precisely one image of the acquired magnetic resonance signals is calculated through known methods according to the encoding scheme P used. In the embodiment, it is a conventional spin-echo acquisition with phase encoding in the first dimension and frequency encoding in the second dimension, for which a spatial distribution of the magnetic resonance signals is calculated with a two-dimensional Fourier transformation. The special aspects of the curved field lines and the non-linear encoding fields of the local gradient system used must be considered in the reconstruction of the images to achieve the necessary imaging fidelity [3-4]. For visualization of the result, an integrated representation of the single MSEM images is generated by evaluating the known relative geometric reference of the MSEM regions.

In summary, the invention comprises a method for determining the spatial distribution of magnetic resonance (MR) signals from an imaging region within MSEM regions of a local gradient system, wherein, in a preparatory step, a spatial encoding scheme is defined; in an execution step, nuclear spins are repeatedly excited with RF pulses, and thereafter spatially encoded according to the spatial encoding scheme, in at least one dimension by means of the local gradient system, and MR signals are acquired, from which their spatial distribution is calculated, visualized and/or stored, wherein, in the preparatory step, a phase encoding scheme with I phase encoding steps is defined, for each phase encoding step according to the phase encoding scheme, an excitation pattern of the transverse magnetization is defined and RF pulses to be irradiated to implement this pattern are calculated, wherein, at all spatial locations of the imaging region within a MSEM region, the same phase is defined and, in the execution step, according to the spatial encoding scheme each encoding step is performed I times according to the phase encoding scheme, wherein selection of the imaging region, amplitude modulation, and phase encoding are performed during excitation of the nuclear spin with the calculated RF pulses. This results in unique determination of the spatial distribution of the magnetic resonance signals with a simple RF receiver configuration using local gradient systems.

LIST OF REFERENCES

AX, AY, AZ Gradient amplifiers for x-, y-, z-gradients
A1, A2 Gradient amplifiers for 2 variants of the local gradients
COMP Computer system DSK Digital storage unit
FOX Field of excitation
GX, GY, GZ Gradient coil sets for global x-, y-, z-gradients
G1, G2 Gradient coil sets for 2 variants of the local gradients
$G_{gx}$, $G_{gy}$, $G_{gz}$ Gradient fields or pulses produced with GX, GY, GZ, G1
$G_{l1}$, $G_{l2}$ or G2
$HF_A$ RF excitation pulse
$HF_R$ RF refocusing pulse
KB Computer keyboard
M Main magnet
MON Monitor
O Object under examination
PNTR Pointing device
RA1, ..., RAm Receiver elements
RX1, ..., RXm Receiver units
SEQ Sequence control unit
TA1, ..., TAn Transmitter elements
TX1, ..., TXn RF power transmitters
V Volume under examination

REFERENCE LIST

[1] U.S. Pat. No. 6,255,821, Oppelt, A.: Nuclear Magnetic Resonance Tomography Device and Method for its Operation
[2] U.S. Pat. No. 5,530,354 Herlihy, D. J. and Herlihy, A.: Non-Monotonic Gradient Coil System for Magnetic Resonance Imaging
[3] US 2007 090 838 A1, Hennig, J.: Apparatus and method for NMR tomography acquisition with local magnetic field gradients in connection with local receiver coils
[4] Hennig, J. et al.: PatLoc: Imaging in Non-Bijective, Curvilinear Magnetic Field Gradients. In: Proc. Ann. Meeting ISMRM, Berlin, p. 453 (2007)
[5] Welz, A. M. et al.: Initial Realization of a Multichannel, Non-Linear PatLoc Gradient Coil. In: Proc. Ann. Meeting ISMRM, Toronto, p. 1163 (2008)
[6] Schultz, G., Hennig, J. and Zaitsev, M.: Image Reconstruction from Ambiguous PatLoc-Encoded MR Data. In: Proc. Ann. Meeting ISMRM, Toronto, p. 786 (2008)
[7] Bernstein, M. A.; King K. F.; Zhou, X. J.: Handbook of MRI Pulse Sequences. Elsevier Academic Press (2004)
[8] de Graaf, R. A.: In vivo NMR spectroscopy. John Wiley & Sons Ltd (1998)
[9] U.S. Pat. No. 5,903,149, Gonen, O. et al.: Three-Dimensional Localized Proton NMR Spectroscopy Using a Hybrid of One-Dimensional Hadamard with Two-Dimensional Chemical Shift Imaging
[10] Pauly, J.; Nishimura, D.; Macovksi A.: A k-space analysis of small-tip-angle excitation. In: Journal of Magnetic Resonance 81 (1989), pp. 43-56
[11] U.S. Pat. No. 5,270,653, Pauly, J. M.: Selective Three Dimensional Excitation for Magnetic Resonance Applications
[12] Ullmann, P.: Parallele Sendetechniken in der Magnetresonanztomographie: Experimentelle Realisierung, Anwendungen und Perspektiven. [online], Freiburg, Univ., Diss., 2007 [cited Apr. 8, 2008] <http://www.freidok.uni-freiburg.de/volltexte/4369/>, <http://nbn-resolving.de/urn:nbn:de:bsz:25-opus-43695>
[13] Saekho, S.; Yip, C.-Y.; Noll, D. C.; Boada, F. E.; Stenger, V. A.: Fast-$k_2$ three-dimensional tailored radiofrequency pulse for reduced B1 inhomogeneity. In: Magnetic Resonance in Medicine 55 (2006), p. 719-724
[14] U.S. Pat. No. 6,005,391, Börnert, P. et al.: Method for Determining the Spatial and/or Spectral Distribution of Nuclear Magnetization
[15] Deutsche Patentanmeldung 10 2007 044 436.1, Ruhm, W.: Verfahren zur Bestimmung der räumlichen Verteilung von Magnetresonanzsignalen durch mehrdimensionale HF-Anregungspulse
[16] Ruhm, W. and Ullmann, P.: Multidimensional Spatial Encoding by Parallel Excitation. In: Proc. Ann. Meeting ISMRM, Toronto, p. 1318 (2008)
[17] Katscher U.; Börnert, P.; Leussler, C.; van den Brink, J. S.: Transmit SENSE. In: Magnetic Resonance in Medicine 49 (2003), pp. 144-150
[18] Zhu, Y.: Parallel Excitation with an Array of Transmit Coils. In: Magnetic Resonance in Medicine 51 (2004), pp. 775-784
[19] Metzger, G. J. et al.: Local $B_1$* Shimming for Prostate Imaging with Transceiver Arrays at 7T Based on Subject-Dependent Transmit Phase Measurements, Magnetic Resonance in Medicine 59 (2008); pp. 396-409
[20] Katscher, U. et al.: B1-Gradient Based MRI Using a Multi-Element Transmit System. In: Proc. Ann. Meeting ISMRM, Berlin, p. 679 (2007)
[21] King, S. B. et al.: Phase Encoding Without Gradients Using TRASE-FSE MRI. In: Proc. Ann. Meeting ISMRM, Berlin, p. 680 (2007)
[22] Yip, C.-Y.; Fessler, J. A.; Noll, D. C.: Iterative RF pulse design for multidimensional, small-tip-angle selective excitation. In: Magnetic Resonance in Medicine 54 (2005), pp. 908-917
[23] Grissom, W.; Yip, C.-Y.; Zhang, Z.; Stenger, V. A.; Fessler, J. A.; Noll, D. C.: Spatial domain method for the design of RF pulses in multicoil parallel excitation. In: Magnetic Resonance of Medicine 56 (2006), pp. 620-629

I claim:

1. A method for determining a spatial distribution of magnetic resonance signals from a predetermined imaging region that is completely covered by N MSEM regions within a volume under examination of a magnetic resonance apparatus, where $N \geq 1$, the method comprising the steps of:

a) executing a preparatory step in which a spatial encoding scheme P with M encoding steps, $M \geq 1$, is defined for spatial encoding in L spatial dimensions within the imaging region, wherein, for phase encoding of the N MSEM regions, a phase encoding scheme A with I phase encoding steps is defined, where $I \geq N \geq 1$, and for each of these phase encoding steps according to phase encoding scheme A, a spatial, complex excitation pattern of a transverse magnetization of nuclear spins is defined, wherein for amplitude modulation, amplitudes within the imaging region are set to be identical for each phase encoding step according to a predetermined distribution, for spatial selection, the amplitudes outside the imaging region are set to zero and, for phase modulation, the phases within the MSEM regions of the imaging region are set according to the defined phase encoding scheme A, wherein a same phase is defined at all locations within a single MSEM region, and a progression over time of the amplitude and phase of RF pulses to be irradiated to excite the nuclear spins is calculated for each defined complex excitation pattern of the phase encoding steps according to phase encoding scheme A and for each transmission element of transmission antenna equipment;

b) carrying out an execution step in which, during each encoding step of the spatial encoding scheme P, the nuclear spins are excited in the volume under examination by at least one RF pulse using RF transmitter antenna equipment having at least one transmitter element, wherein, after this RF excitation, spatial encoding according to the spatial encoding scheme P by means of additional magnetic fields of a global and/or local gradient system that are variable over time and space is performed, the spatial encoding being performed in at least one spatial dimension by means of a local gradient system and being unique within each of the N non-overlapping MSEM regions, but not for multiple MSEM regions and not in an entire volume under examination, wherein the spatial encoding performed by a global gradient system with respect to each dimension to be mapped therewith is unique in the entire volume under examination, and magnetic resonance signals generated by excited nuclear spins are acquired by means of RF receiving antenna equipment with at least one receiver element, wherein each encoding step that is executed according to spatial encoding scheme P is performed I times according to phase encoding scheme A, wherein, for excitation of the nuclear spins for each phase encoding step according to phase encoding scheme A, an RF pulse or RF pulses calculated for this are applied so that selection of the imaging region as well as amplitude modulation and phase encoding within the imaging region according to phase encoding scheme A are performed during excitation of the nuclear spins, wherein for the case of a single phase encoding step, that is, I=N=1, gradients are also applied simultaneously with the RF pulse irradiation;

c) executing a reconstruction step in which one or more spatial distributions of magnetic resonance signals or quantities derived from them are calculated from magnetic resonance signals acquired in all encoding steps according to the spatial encoding scheme P, a spatial distribution of the magnetic resonance signals being determined separately for each of the N MSEM regions; and d) carrying out a visualization step in which results of reconstruction and/or one or more quantities derived from them are stored and/or visualized, wherein results of the reconstruction are visualized separately for each of the N MSEM regions and/or integrated with reference to a shared reference system.

2. The method of claim 1, wherein excitation of the nuclear spins is performed by means of at least two transmitter elements.

3. The method of claim 1, wherein unique spatial encoding is effected in the entire volume under examination by the additional magnetic field of the global gradient system in each of the L dimensions to be mapped, and, in the preparatory step, a k-space trajectory, defined by means of gradient pulses generated with the global gradient system, is selected for phase encoding according to phase encoding scheme A and the progression over time of the amplitude and phase of the RF pulse or pulses irradiated to excite the nuclear spins is calculated for the selected k-space trajectory, wherein, in the execution step, the calculated RF pulse or pulses are applied while the selected k-space trajectory is traversed.

4. The method of claim 3, wherein precisely one phase encoding step is performed according to phase encoding scheme A, that is, I=1.

5. The method of claim 3, wherein excitation of the nuclear spins is performed with a multidimensional RF pulse.

6. The method of claim 3, wherein excitation of the nuclear spins is performed by means of a single transmitter element or by means of a volume resonator.

7. The method of claim 3, wherein the k-space trajectory that is traversed during excitation is undersampled.

8. The method of claim 3, wherein reception of the magnetic resonance signals is performed by means of a single receiver element or a volume resonator.

9. The method of claim 1, wherein reception of the magnetic resonance signals is performed by means of at least two receiver elements.

10. The method of claim 9, wherein parallel imaging techniques are used or are used to shorten a measurement time and/or to increase spatial resolution.

11. The method of claim 3, wherein the k-space trajectory comprises at least one spiral-shaped component that is traversed from outside to inside or from inside to outside.

12. The method of claim 3, wherein the k-space trajectory comprises several spiral-shaped components that are traversed alternately from outside to inside and from inside to outside.

13. The method of claim 12, wherein, on completion of irradiation with the RF pulse, the k-space trajectory used ends at a center of k-space or in its vicinity and/or the gradient pulses used attain very small or vanishing amplitudes.

14. The method of claim 1, wherein the imaging region is adapted to anatomical, morphological, or functional circumstances of an object under examination.

15. The method of claim 1, wherein the imaging region is limited to a magnitude absolutely necessary for a measurement task.

16. The method of claim 1, wherein the imaging region is adapted based on local imaging characteristics of the local gradient system or is limited to regions with an especially high gradient strength of the additional magnetic fields.

17. The method of claim 3, wherein a two-dimensional RF pulse is used for excitation, and spatial selection in a third spatial direction is performed by slice-selective phase refocusing through an effect of a global gradient.

18. The method of claim 3, wherein a two-dimensional RF pulse is used for excitation, and spatial encoding and/or spatial selection in a spatial direction that is linearly independent thereof is performed through frequency encoding by the effect of a global gradient in that direction during data acquisition.

19. The method of claim 3, wherein the spatial encoding is performed by means of the local gradient system in one spatial dimension, the spatial encoding according to spatial encoding scheme P in two spatial directions that are different from the former being performed by the global gradient system.

20. The method of claim 1, wherein the spatial encoding in two spatial dimensions is performed by means of the local gradient system and the spatial encoding in one spatial direction that is linearly independent thereof is performed by the global gradient system.

21. The method of claim 20, wherein the phase encoding scheme A is a two-dimensional encoding scheme.

22. The method of claim 1, wherein the spatial encoding in three spatial dimensions is performed using the local gradient system.

23. The method of claim 22, wherein the phase encoding scheme A is a two- or three-dimensional encoding scheme.

24. The method of claim 1, wherein determination of an assignment of magnetic resonance signals to one of the N MSEM regions is performed with an assistance of Fourier, Hadamard or Wavelet transformation.

25. The method of claim 1, wherein calculation of an assignment of magnetic resonance signals to one of the N MSEM regions is performed with assistance of one-, two-, or three-dimensional Fourier transformation.

26. The method of claim 1, wherein the excitation amplitudes are defined according to a uniform distribution within the imaging region.

27. The method of claim 1, wherein, before execution of the phase encoding steps, the nuclear spin system is put into a steady state by repeated traversal of the excitation cycle of the execution step without data acquisition or further use.

28. The method of claim 1, wherein spoiler gradients are used in each phase encoding step to dephase unwanted residual transverse magnetization.

* * * * *